United States Patent
Roham et al.

(10) Patent No.: US 9,800,246 B2
(45) Date of Patent: Oct. 24, 2017

(54) LEVEL SHIFTER APPLICABLE TO LOW VOLTAGE DOMAIN TO HIGH VOLTAGE DOMAIN CONVERSION

(71) Applicant: QUALCOMM Incorporated, San Diego, CA (US)

(72) Inventors: Masoud Roham, San Diego, CA (US); Yanjie Meng, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/859,030

(22) Filed: Sep. 18, 2015

(65) Prior Publication Data
US 2017/0085265 A1    Mar. 23, 2017

(51) Int. Cl.
*H03L 5/00* (2006.01)
*H03K 19/0185* (2006.01)
*H03K 3/356* (2006.01)

(52) U.S. Cl.
CPC . *H03K 19/018521* (2013.01); *H03K 3/35613* (2013.01); *H03K 3/356182* (2013.01)

(58) Field of Classification Search
CPC ..... H03K 3/356113; H03K 19/018521; H03K 19/00315
USPC .................. 326/61–62, 80–81; 327/306, 333
See application file for complete search history.

(56) References Cited

U.S. PATENT DOCUMENTS

| | | | |
|---|---|---|---|
| 7,205,820 B1 | 4/2007 | Yeung et al. | |
| 7,259,610 B1 * | 8/2007 | Bell | H03K 3/012 326/68 |
| 7,605,633 B2 * | 10/2009 | Maejima | G11O 5/147 327/306 |
| 7,659,767 B2 * | 2/2010 | Chen | H03K 19/01707 327/333 |
| 7,847,612 B2 * | 12/2010 | Ku | H03K 3/356113 327/333 |
| 8,217,701 B2 | 7/2012 | Kim | |
| 8,237,487 B2 | 8/2012 | Shim | |
| 8,598,934 B2 * | 12/2013 | Otani | H03K 3/356165 326/68 |

(Continued)

OTHER PUBLICATIONS

International Search Report and Written Opinion—PCT/US2016/050437—ISA/EPO—dated Nov. 30, 2016.

*Primary Examiner* — Dinh T Le
(74) *Attorney, Agent, or Firm* — Loza & Loza, LLP/Qualcomm

(57) ABSTRACT

A level shifter includes a latch circuit having a first FET and a second FET; an input circuit having a third FET and a fourth FET, the gates of the first and second FETs being coupled to the drains of the fourth and third FETs, respectively; a first resistive device (resistor, diode-connected FET) coupled between and in series with the first and third FETs between a first voltage rail and a second voltage rail; and a second resistive device (resistor, diode-connected FET) coupled between and in series with the second and fourth FETs between the first and second voltage rails. The gates of the third and fourth FETs are configured to receive a first set of complementary voltages, and a second set of complementary voltages are configured to be generated at the gates of the first and second FETs, respectively. The second set of complementary voltages are based on the first set of complementary voltages.

16 Claims, 5 Drawing Sheets

(56) References Cited

U.S. PATENT DOCUMENTS

| | | | |
|---|---|---|---|
| 9,024,675 B2* | 5/2015 | Sul | H03K 19/018507 |
| | | | 326/68 |
| 9,059,700 B2 | 6/2015 | Viani | |
| 2005/0007176 A1 | 1/2005 | Seki | |
| 2009/0108904 A1 | 4/2009 | Shiffer, II | |
| 2009/0315610 A1 | 12/2009 | Han et al. | |
| 2012/0038611 A1 | 2/2012 | Otani et al. | |
| 2013/0162294 A1* | 6/2013 | Henmi | H03K 19/018507 |
| | | | 326/80 |

* cited by examiner

LEVEL SHIFTER APPLICABLE TO LOW VOLTAGE DOMAIN TO HIGH VOLTAGE DOMAIN CONVERSION

BACKGROUND

Field

Aspects of the present disclosure relate generally to level shifters, and more particularly, to a level shifter applicable to low voltage domain to high voltage domain conversion.

Background

A level shifter is used to convert an input logic voltage from a first voltage domain to a second voltage domain. In some cases, the first voltage domain has logic voltage levels that are smaller than the logic voltage levels of the second voltage domain. In other cases, the first voltage domain has logic voltage levels that are greater than the logic voltage levels of the second voltage domain. This disclosure is applicable to level shifters where the first voltage domain has logic voltage levels smaller than the logic voltage levels of the second voltage domain.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first latch circuit including a first field effect transistor (FET) and a second FET; a first input circuit including third and fourth FETs, wherein the gates of the first and second FETs are coupled to the drains of the fourth and third FETs, respectively; a first resistive device coupled between the first and third FETs, wherein the first FET, the first resistive device, and the third FET are coupled in series between a first voltage rail and a second voltage rail; and a second resistive device coupled between the second and fourth FETs, wherein the second FET, the second resistive device, and the fourth FET are coupled in series between the first and second voltage rails. The gates of the third and fourth FETs are configured to receive a first set of complementary voltages. A second set of complementary voltages are configured to be generated at the drains of the fourth and third FETs, respectively. The second set of complementary voltages are based on the first set of complementary voltages.

Another aspect of the disclosure relates to a method including generating a first set of complementary high and low voltages at first and second nodes, respectively; receiving a second set of complementary high and low voltages at third and fourth nodes, respectively; and changing the first set of complementary high and low voltages at the second and first nodes, respectively, in response to receiving the second set of complementary high and low voltages at the third and fourth nodes, respectively. The changing of the first set of complementary high and low voltages includes reducing the high voltage at the first node by generating a current through a first resistive device situated between a first voltage rail and the first node; and increasing the low voltage at the second node in response to the reduction of the high voltage at the first node.

Another aspect of the disclosure relates to an apparatus includes means for generating a first set of complementary high and low voltages at first and second nodes, respectively; means for receiving a second set of complementary high and low voltages at third and fourth nodes, respectively; means for changing the first set of complementary high and low voltages at the second and first nodes, respectively, in response to receiving the second set of complementary high and low voltages at the third and fourth nodes, respectively. The means for changing the first set of complementary high and low voltages includes means for reducing the high voltage at the first node by generating a current through a first resistive means situated between a first voltage rail and the first node; and means for increasing the low voltage at the second node in response to the reduction of the high voltage at the first node.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
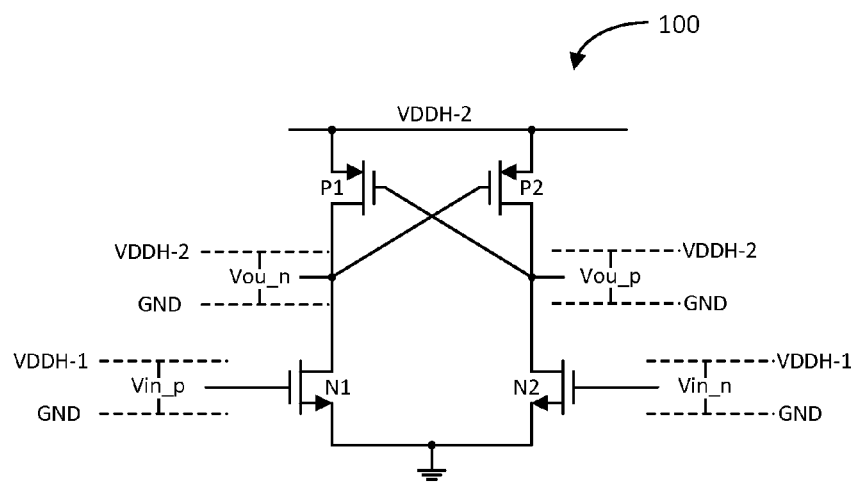
FIG. 1 illustrates a schematic diagram of an exemplary level shifter in accordance with an aspect of the disclosure.

FIG. 1 illustrates a schematic diagram of an exemplary level shifter 100 in accordance with an aspect of the disclosure. The level shifter 100 includes first and second differential input transistors, such as n-channel metal oxide semiconductor field effect transistors ("NMOS FETs" or simply "NMOS") N1 and N2. The level shifter 100 further includes a latch circuit having a first transistor and a second latch transistor, such as p-channel metal oxide semiconductor field effect transistors ("PMOS FETs" or simply "PMOS") P1 and P2.

The first latch transistor PMOS P1 and the first differential input transistor NMOS N1 are coupled in series between a first voltage rail (e.g., VDDH-2) and a second voltage rail (e.g., ground). Similarly, the second latch transistor PMOS P2 and the second differential input transistor NMOS N2 are coupled in series between the first voltage rail (e.g., VDDH-2) and the second voltage rail (e.g., ground).

The gates of NMOS N1 and N2 are configured to receive complementary input voltages Vin_p and Vin_n, respectively. The complementary input voltages Vin_p and Vin_n swing between a high logic voltage (e.g., VDDH-1) and a low logic voltage (e.g., ground) in accordance with a first voltage domain. As an example, the first voltage domain may specify high and low logic voltages for an integrated circuit (IC) core, such as a processor core or a memory core.

The gate of PMOS P1 is coupled to the drain of NMOS N2, and the gate of PMOS P2 is coupled to the drain of NMOS N1. The level shifter 100 is configured to generate complementary output voltages Vou_p and Vou_n at the respective drains of NMOS N2 and N1. The complementary output voltages Vou_p and Vou_n swing between a high logic voltage (e.g., VDDH-2) and a low logic voltage (e.g., ground) in accordance with a second voltage domain. As an example, the second voltage domain may specify high and low logic voltages for input/output (I/O) circuits of an IC.

The operation of the level shifter 100 is as follows: In this example, an initial state is assumed where the complementary input voltages Vin_p and Vin_n are respectively at low and high logic voltage levels (e.g., ground and VDDH-1) in accordance with the first voltage domain, and the complementary output voltages Vou_p and Vou_n are respectively at low and high logic voltage levels (e.g., ground and VDDH-2) in accordance with the second voltage domain. In this initial state, NMOS N1 is turned off, NMOS N2 is turned on, PMOS P1 is turned on, and PMOS P2 is turned off.

The complementary input voltages Vin_p and Vin_n are then changed to high and low logic voltage levels, respectively. The high voltage level at the gate of NMOS N1 causes NMOS N1 to turn on, and the low voltage level at the gate of NMOS N2 causes NMOS N2 to turn off. The turning on of NMOS N1 pulls down the voltage at the gate of PMOS P2 to below its threshold voltage (VDDH-2−$V_T$); thereby, turning on PMOS P2 and causing the complementary output voltage Vou_p to rise to the high voltage level (VDDH-2) of the second voltage domain. The complementary output voltage Vou_p being at the high voltage level (VDDH-2), which is also applied to the gate of PMOS P1, causes PMOS P1 to turn off; thereby, allowing NMOS N1 to further pull down the complementary output voltage Vou_n to substantially ground.

Similarly, when the complementary input voltages Vin_p and Vin_n are subsequently changed to low and high logic voltage levels, respectively. The high voltage level at the gate of NMOS N2 causes NMOS N2 to turn on, and the low voltage level at the gate of NMOS N1 causes NMOS N1 to turn off. The turning on of NMOS N2 pulls down the voltage at the gate of PMOS P1 to below its threshold voltage (VDDH-2−$V_T$); thereby, turning on PMOS P1 and causing the complementary output voltage Vou_n to rise to the high voltage level (VDDH-2) of the second voltage domain. The complementary output voltage Vou_n being at the high voltage level (VDDH-2), which is also applied to the gate of PMOS P2, causes PMOS P2 to turn off; thereby, allowing NMOS N2 to further pull down the complementary output voltage Vou_p to substantially ground.

An issue associated with the level shifter 100 occurs when there is a large difference between the high voltage level of the second voltage domain and the high voltage level of the first voltage domain (i.e., when VDDH-2 (e.g., 1.95V) >>VDDH-1 (e.g., 0.35V)). In such case, the high voltage level VDDH-1 of the first voltage domain may not be able to turn on NMOS N1 (or NMOS N2) sufficiently to pull down the voltage at the gate of PMOS P2 (or PMOS P1) to below its threshold voltage (VDDH-2−$V_T$). Thus, PMOS P2 (or PMOS P1) does not turn on, and consequently, PMOS P1 (or PMOS P2) does not turn off—in other words, the latch circuit does not change state.

One technique to address this issue is to make NMOS N1 (as well as NMOS N2) strong (e.g., relatively low resistance when turned on) and make PMOS P1 (as well as PMOS P2) weak (e.g., relatively high resistance when turned on). This produces a large voltage drop across PMOS P1 (as well as PMOS P2) and a low voltage drop across N1 (as well as NMOS N2), which allows the voltage at the gate of PMOS P2 (as well as PMOS P1) to be pulled down below its threshold voltage (VDDH-2−$V_T$). However, this technique results in NMOS N1 and N2 being made large due to the channel width W being increased to make NMOS N1 and N2 strong, and PMOS P1 and P2 likewise being made large due to the channel length L being increased to make PMOS P1 and P2 weak.

Figure 2:
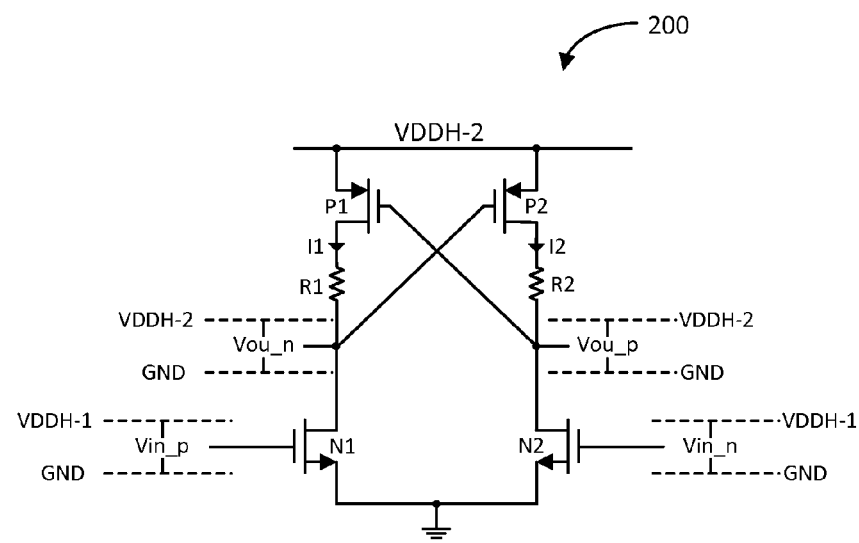
FIG. 2 illustrates a schematic diagram of another exemplary level shifter in accordance with another aspect of the disclosure.

FIG. 2 illustrates a schematic diagram of another exemplary level shifter 200 in accordance with another aspect of the disclosure. The level shifter 200 differs from that of level shifter 100 in that level shifter 200 further includes a first resistor R1 coupled between PMOS P1 and NMOS N1, and a second resistor R2 coupled between PMOS P2 and NMOS N2. As discussed in more detail below, the resistors R1 and R2 produce additional voltage drops to lower the voltages at the respective gates of PMOS P2 and P1 below their threshold voltage (VDDH-2−$V_T$); and thus, assist the latch circuit in changing state.

As in the previous example, an initial state is assumed where the complementary input voltages Vin_p and Vin_n are respectively at low and high logic voltage levels (e.g., ground and VDDH-1) in accordance with the first voltage domain, and the complementary output voltages Vou_p and Vou_n are respectively at low and high logic voltage levels (e.g., ground and slightly less than VDDH-2) in accordance with the second voltage domain. In this initial state, NMOS N1 is turned off, NMOS N2 is turned on, PMOS P1 is turned on, and PMOS P2 is turned off.

The complementary input voltages Vin_p and Vin_n are then changed to high and low logic voltage levels, respectively. The high voltage level at the gate of NMOS N1 causes NMOS N1 to turn on, and the low voltage level at the gate of NMOS N2 causes NMOS N2 to turn off. The turning on of NMOS N1 produces an initial current I1 from the first voltage rail (e.g., VDDH-2) to the second voltage rail (e.g., ground) via PMOS P1, resistor R1, and NMOS N1. The initial current I1 produces a negligible voltage drop across PMOS P1 (as PMOS P1 is turned on) and a larger voltage drop across the resistor R1. The resistor R1 is configured to have a resistance $R_1$ such that the voltage drop the across resistor R1 produces a complementary output voltage Vou_n that is less than or equal to the threshold voltage (VDDH-2−$V_T$) of PMOS P2:

$$VDDH\text{-}2\text{-}I1^*R_1 \leq VDDH\text{-}2\text{-}V_T \qquad \text{Eq. 1}$$

As such, the complementary output voltage Vou_n being less than or equal to the threshold voltage (VDDH-2-$V_T$) of PMOS P2, which is applied to the gate of PMOS P2, causes PMOS P2 to turn on. As NMOS N2 is turned off, the turning on of PMOS P2 causes the complementary output voltage Vou_p to rise to substantially VDDH-2, i.e., above the threshold voltage (VDDH-2-$V_T$) of PMOS P1. As such, the complementary output voltage Vou_p, which is applied to the gate of PMOS P1, causes PMOS P1 to turn off. The turning off of PMOS P1 allows for NMOS N1 to force the complementary output voltage Vou_n to substantially ground. Thus, the resistor R1 assists in the latch circuit changing state in response to the complementary input voltages Vin_p and Vin_n changing to high and low logic voltage levels, respectively.

Similarly, when the complementary input voltages Vin_p and Vin_n are subsequently changed to low and high logic voltage levels, respectively. The high voltage level at the gate of NMOS N2 causes NMOS N2 to turn on, and the low voltage level at the gate of NMOS N1 causes NMOS to turn off. The turning on of NMOS N2 produces an initial current I2 from the first voltage rail (e.g., VDDH-2) to the second voltage rail (e.g., ground) via PMOS P2, resistor R2, and NMOS N2. The initial current I2 produces a negligible voltage drop across PMOS P2 (as PMOS P2 is turned on) and a larger voltage drop across the resistor R2. The resistor R2 is configured to have a resistance $R_2$ such that the voltage drop across resistor R2 produces a complementary output voltage Vou_p that is less than or equal to the threshold voltage (VDDH-2-$V_T$) of PMOS P2:

$$VDDH\text{-}2\text{-}I2^*R_2 \leq VDDH\text{-}2\text{-}V_T \qquad \text{Eq. 2}$$

As such, the complementary output voltage Vou_p being less than or equal to the threshold voltage (VDDH-2-$V_T$) of PMOS P1, which is applied to the gate of PMOS P1, causes PMOS P1 to turn on. As NMOS N1 is turned off, the turning on of PMOS P1 causes the complementary output voltage Vou_n to rise to substantially VDDH-2, i.e., above the threshold voltage (VDDH-2-$V_T$) of PMOS P2. As such, the complementary output voltage Vou_n, which is applied to the gate of PMOS P2, causes PMOS P2 to turn off. The turning off of PMOS P2 allows for NMOS N2 to force the complementary output voltage Vou_p to substantially ground. Thus, the resistor R2 assists in the latch circuit changing state in response to the complementary input voltages Vin_p and Vin_n changing to low and high logic voltage levels, respectively.

Figure 3:
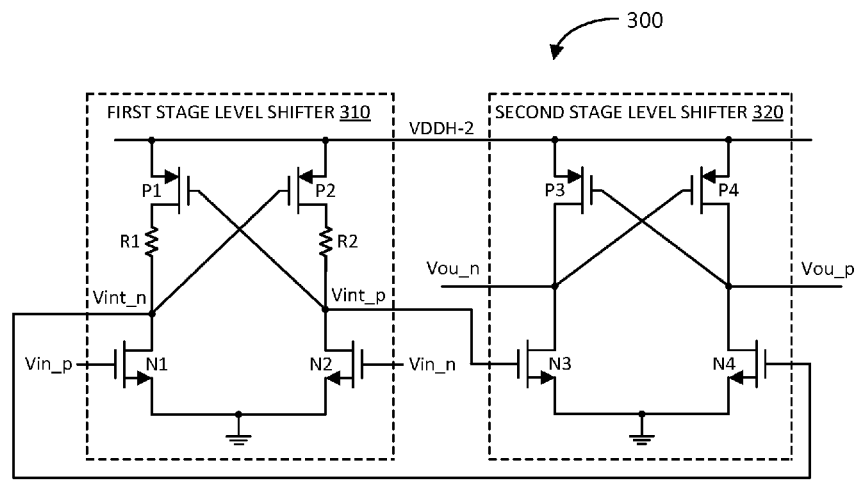
FIG. 3 illustrates a schematic diagram of another exemplary level shifter in accordance with another aspect of the disclosure.

FIG. 3 illustrates a schematic diagram of another exemplary level shifter 300 in accordance with another aspect of the disclosure. The level shifter 300 is similar to that of level shifter 200, except that the level shifter 300 further includes an additional level shifter to ensure that complementary output voltages Vou_p and Vou_n are able to fully swing between the high and low logic voltage levels (e.g., VDDH-2 and ground) of the second voltage domain.

In particular, the level shifter 300 includes a first stage level shifter 310 configured similar to that of level shifter 200. That is, the first stage level shifter 310 includes first latch transistor PMOS P1, resistor R1, and first complementary input transistor NMOS N1 coupled between a first voltage rail (e.g., VDDH-2) and a second voltage rail (e.g., ground). The first stage level shifter 310 further includes a second latch transistor PMOS P2, resistor R2, and second complementary input transistor NMOS N2 coupled between VDDH-2 and ground. The gates of PMOS P1 and P2 are coupled to the drains of NMOS N2 and N1, respectively.

As in level shifter 200, complementary input voltages Vin_p and Vin_n are applied to the gates of the NMOS N1 and N2, respectively. The first stage level shifter 310 is configured to generate complementary intermediate voltages Vint_p and Vint_n at the drains of NMOS N2 and N1, respectively. As in level shifter 200, the complementary input voltages Vin_p and Vin_n may swing between a high logic voltage (e.g., VDDH-1) and a low logic voltage (e.g., ground) in accordance with a first voltage domain. The complementary intermediate voltages Vint_p and Vint_n may swing slightly less than the full swing of a high logic voltage (e.g., VDDH-2) and a low logic voltage (e.g., ground) in accordance with a second voltage domain.

The reason why the complementary intermediate voltages Vint_p and Vint_n may swing slightly less than the full swing of the high and low voltages of the second voltage domain is that there is some leakage current through NMOS N1 and N2 when these devices are turned off. The leakage current produces voltage drops across the corresponding resistors R1 and R2 resulting in the high-state of the complementary intermediate voltages Vint_p and Vint_n being slightly less than the full rail voltage of VDDH-2. That is, complementary intermediate voltages Vint_p and Vint_n may have high logic level voltages represented by the following equations:

$$Vint\_p(\text{high}) \approx VDDH\text{-}2\text{-}Ileak\_N2^*R_2 \qquad \text{Eq. 3}$$

$$Vint\_p(\text{high}) \approx VDDH\text{-}2\text{-}Ileak\_N2^*R_2 \qquad \text{Eq. 4}$$

Where VDDH-2 is the full rail voltage, Ileak_N2 is the leakage current associated with NMOS N2, $R_2$ is the resistance of resistor R2, Ileak_N1 is the leakage current associated with NMOS N1, and $R_1$ is the resistance of resistor R1.

Accordingly, the level shifter 300 further includes a second stage level shifter 320 to ensure that complementary output voltage Vout_p and Vou_n are able to fully swing between the high and low voltages (e.g., VDDH-2 and ground) of the second voltage domain. In particular, the second stage level shifter 320 includes a third latch transistor PMOS P3 and a third complementary input transistor NMOS N3 coupled between VDDH-2 and ground. The second stage level shifter 320 further includes a fourth latch transistor PMOS P4 and a fourth complementary input transistor NMOS N4 coupled between VDDH-2 and ground. The gates of PMOS P3 and P4 are coupled to the drains of NMOS N4 and N3, respectively.

The complementary intermediate voltages Vint_p and Vint_n generated by the first stage level shifter 310 are applied to the gates of the NMOS N3 and N4, respectively. The second stage level shifter 320 is configured to generate complementary output voltages Vou_p and Vou_n at the drains of PMOS P4 and P3, respectively. In the second stage level shifter 320, the complementary output voltages Vou_p and Vou_n are configured to substantially fully swing between the high logic voltage (e.g., VDDH-2) and the low logic voltage (e.g., ground) of the second voltage domain. This is because the complementary output voltages Vou_p and Vou_n are generated at the drains of PMOS P4 and P3, and these devices have negligible voltage drops when they are turned on.

Figure 4:
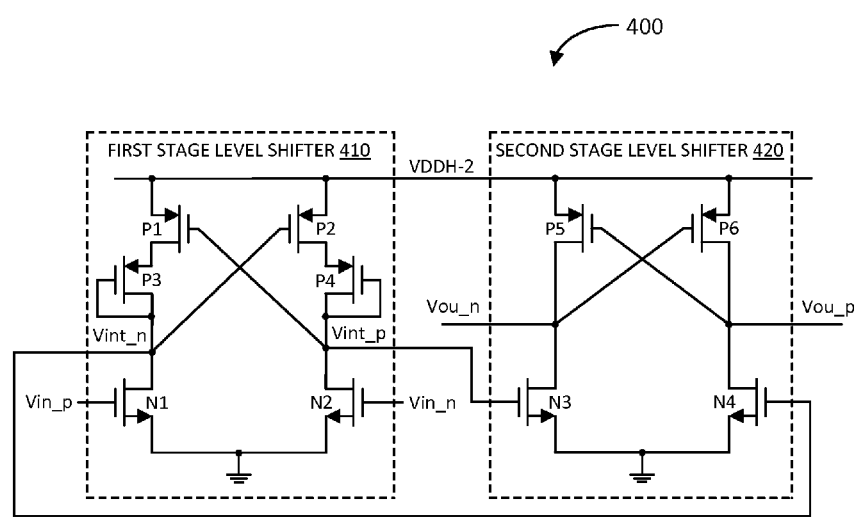
FIG. 4 illustrates a schematic diagram of yet another exemplary level shifter in accordance with another aspect of the disclosure.

FIG. 4 illustrates a schematic diagram of another exemplary level shifter 400 in accordance with another aspect of the disclosure. The level shifter 400 is similar to that of level shifter 300, except that the level shifter 400 includes another type of resistive devices coupled between latch transistors and input transistors, respectively. In particular, the resistive devices in the case of level shifter 400 are diode-connected PMOS.

More specifically, the level shifter 400 includes a first stage level shifter 410 including a first latch transistor PMOS P1, a first diode-connected transistor PMOS P3, and a first complementary input transistor NMOS N1 coupled between a first voltage rail (e.g., VDDH-2) and a second voltage rail (e.g., ground). The first stage level shifter 410 further includes a second latch transistor PMOS P2, a second diode-connected transistor PMOS P4, and a second complementary input transistor NMOS N2 coupled between VDDH-2 and ground. The gates of PMOS P1 and P2 are coupled to the drains of NMOS N2 and N1, respectively.

The diode-connected PMOS P3 includes a source coupled to the drain of PMOS P1. The diode-connected PMOS P3 further includes gate and drain coupled together to form the diode configuration of PMOS P3, wherein the gate and drain are coupled to the drain of NMOS N1. Similarly, the diode-connected PMOS P4 includes a source coupled to the drain of PMOS P2. The diode-connected PMOS P4 further includes gate and drain coupled together to form the diode configuration of PMOS P4, wherein the gate and drain are coupled to the drain of NMOS N2.

Complementary input voltages Vin_p and Vin_n are applied to the gates of the NMOS N1 and N2, respectively. The first stage level shifter 410 is configured to generate complementary intermediate voltages Vint_p and Vint_n at the drains of NMOS N2 and N1, respectively. As in previously discussed level shifters, the complementary input voltages Vin_p and Vin_n may swing between a high logic voltage (e.g., VDDH-1) and a low logic voltage (e.g., ground) in accordance with a first voltage domain. The complementary intermediate voltages Vint_p and Vint_n may swing slightly less than the full swing of a high logic voltage (e.g., VDDH-2) and a low logic voltage (e.g., ground) in accordance with a second voltage domain.

The diode-connected PMOS P3 and P4 are configured to exhibit relatively low resistance when the voltage across the respective device is equal to or greater than its threshold voltage. Also, the diode-connected PMOS P3 and P4 are configured to exhibit relatively high resistance when the voltage across the respective device is less than its threshold voltage. Further, the threshold voltages of the diode-connected PMOS P3 and P4 may be configured substantially the same as the threshold voltages of PMOS P2 and P1.

The operation of the first stage level shifter 410 is as follows: an initial state is assumed where the complementary input voltages Vin_p and Vin_n are respectively at low and high logic voltage levels (e.g., ground and VDDH-1) in accordance with the first voltage domain, and the complementary intermediate voltages Vou_p and Vou_n are respectively at low and high logic voltage levels (e.g., ground and slightly less than VDDH-2) in accordance with the second voltage domain. In this initial state, NMOS N1 is turned off, NMOS N2 is turned on, PMOS P1 is turned on, and PMOS P2 is turned off.

Also, in this initial state, diode-connected PMOS P3 is exhibiting a relatively high resistance, and diode-connected PMOS P4 is not biased. One reason the diode-connected PMOS P3 is exhibiting relative high resistance is that NMOS N1 is turned off, and therefore, the current through diode-connected PMOS P3 is relatively small. Accordingly, the voltage (drain-to-source voltage) across PMOS P3 is less than its threshold voltage; and thus, diode-connected PMOS P3 is exhibiting relatively high resistance. Diode-connected PMOS P4 is not biased as PMOS P2 is turned off; and thus, no bias voltage (VDDH-2) is being applied to PMOS P4.

The complementary input voltages Vin_p and Vin_n are then changed to high and low logic voltage levels, respectively. The high voltage level at the gate of NMOS N1 causes NMOS N1 to turn on, and the low voltage level at the gate of NMOS N2 causes NMOS N2 to turn off. The turning on of NMOS N1 produces an initial current from the first voltage rail (e.g., VDDH-2) to the second voltage rail (e.g., ground) via PMOS P1, diode-connected PMOS P3, and NMOS N1. The initial current produces a negligible voltage drop across PMOS P1 (as PMOS P1 is turned on) and a larger voltage drop across the diode-connected PMOS P3, as it is currently biased for relatively high resistance as previously discussed. The relatively high resistance of diode-connected PMOS P3 effectively isolates the drain of NMOS N1 from VDDH-2; thereby, allowing the complementary intermediate voltage Vint_n to decrease.

When the complementary intermediate voltage Vint_n decreases to below the threshold voltage of PMOS P2, PMOS P2 turns on and VDDH-2 is applied to diode-connected PMOS P4. As the gate/drain of diode-connected PMOS P4 was previously at a low logic voltage (e.g., ground), VDDH-2 being applied to the source of diode-connected PMOS P4 causes the diode-connected PMOS P4 to exhibit relatively low resistance. Accordingly, the complementary intermediate voltage Vint_p rises to slightly below VDDH-2 as there is a slight voltage drop across diode-connected PMOS P4. The rise of the complementary intermediate voltage Vint_p to slightly below VDDH-2 causes PMOS P1 to turn off. This allows the NMOS N1 to continue to decrease the complementary intermediate voltage Vint_n to substantially ground.

After the aforementioned operation, NMOS N1 is turned on, NMOS N2 is turned off, PMOS P1 is turned off, and PMOS P2 is turned on. The diode-connected PMOS P3 is not biased as PMOS P1 is turned off thereby, not allowing VDDH-2 to bias the diode-connected PMOS P3. The diode-connected PMOS P4 is biased to exhibit relatively high resistance because the voltage drop (i.e., drain-to-source voltage) across the device is below its threshold voltage (that is, the source of P4 is essentially VDDH-2 and the gate/drain are at slightly below VDDH-2 due to leakage current of NMOS N2).

The operation of the first stage level shifter 410 is similar as discussed above when the complementary input voltages Vin_p and Vin_n are subsequently changed to low and high logic voltages, respectively. That is, the high voltage level at the gate of NMOS N2 causes N2 to turn on, and the low voltage level at the gate of NMOS N1 causes N1 to turn off. The turning on of NMOS N2 produces an initial current from the first voltage rail (e.g., VDDH-2) to the second voltage rail (e.g., ground) via PMOS P2, diode-connected PMOS P4, and NMOS N2. The initial current produces a negligible voltage drop across PMOS P2 (as PMOS P2 is turned on) and a larger voltage drop across the diode-connected PMOS P4, as it is currently biased for relatively high resistance as previously discussed. The relatively high resistance of diode-connected PMOS P4 effectively isolates the drain of NMOS N2 from VDDH-2; thereby, allowing complementary intermediate voltage Vint_p to decrease.

When the complementary intermediate voltage Vint_p decreases to below the threshold voltage of PMOS P1, PMOS P1 turns on and VDDH-2 is applied to diode-connected PMOS P3. As the gate/drain of diode-connected PMOS P3 was previously at a low logic voltage (e.g., ground), VDDH-2 being applied to the source of diode-connected PMOS P3 causes the diode-connected PMOS P3 to exhibit relatively low resistance. Accordingly, the complementary intermediate voltage Vint_n rises to slightly below VDDH-2 as there is a slight voltage drop across diode-connected PMOS P3. The rise of the complementary intermediate voltage Vint_n to slightly below VDDH-2 causes PMOS P2 to turn off. This allows the NMOS N2 to continue to decrease the complementary intermediate voltage Vint_p to substantially ground.

After the aforementioned operation, NMOS N2 is turned on, NMOS N1 is turned off, PMOS P2 is turned off, and PMOS P1 is turned on. The diode-connected PMOS P4 is not biased as PMOS P2 is turned off; thereby, not allowing VDDH-2 to bias the diode-connected PMOS P2. The diode-connected PMOS P3 is biased to exhibit relatively high resistance because the voltage drop (i.e., drain-to-source voltage) across the device is below its threshold voltage (that is, the source of P3 is essentially VDDH-2 and the gate/drain are at slightly below VDDH-2 due to leakage current of NMOS N1).

As the complementary intermediate voltages Vint_p and Vint_n do not achieve full voltage swing in accordance with the second voltage domain, the level shifter 400 further includes a second stage level shifter 420 to ensure that complementary output voltage Vout_p and Vou_n are able to fully swing between the high and low voltages (e.g., VDDH-2 and ground) of the second voltage domain. In particular, the second stage level shifter 420 includes a third latch transistor PMOS P5 and a third complementary input transistor NMOS N3 coupled between VDDH-2 and ground. The second stage level shifter 420 further includes a fourth latch transistor PMOS P6 and a fourth complementary input transistor NMOS N4 coupled between VDDH-2 and ground. The gates of PMOS P5 and P6 are coupled to the drains of NMOS N4 and N3, respectively.

The complementary intermediate voltages Vint_p and Vint_n generated by the first stage level shifter 410 are applied to the gates of the NMOS N3 and N4, respectively. The second stage level shifter 420 is configured to generate complementary output voltages Vou_p and Vou_n at the drains of PMOS P6 and P5, respectively. In the second stage level shifter 420, the complementary output voltages Vou_p and Vou_n are configured to fully swing between the high logic voltage (e.g., VDDH-2) and the low logic voltage (e.g., ground) of the second voltage domain. This is because the complementary output voltages Vou_p and Vou_n are generated at the drains of PMOS P6 and P5, and these devices have negligible voltage drops when they are turned on.

Figure 5:
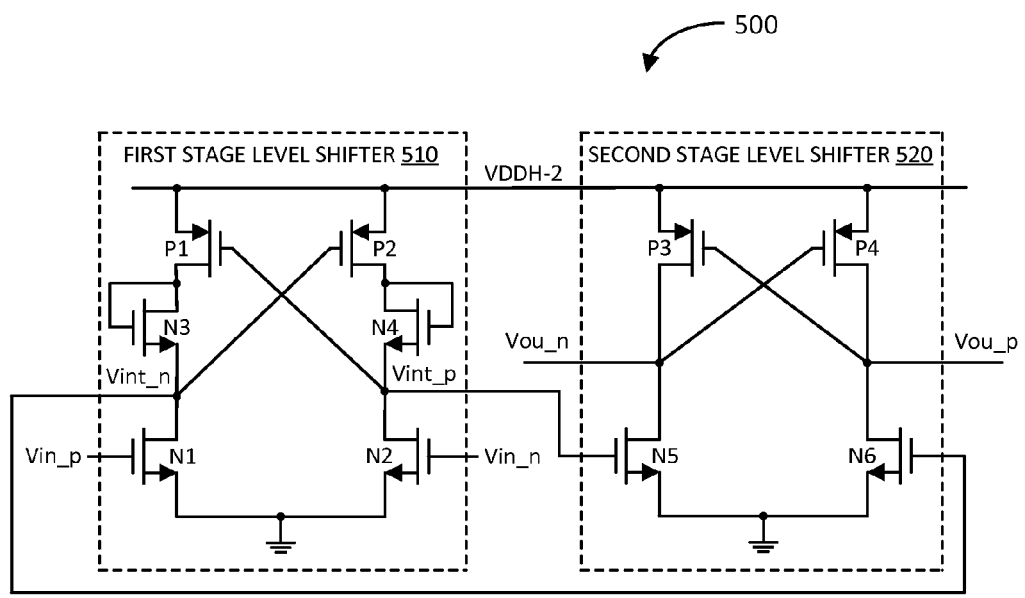
FIG. 5 illustrates a schematic diagram of still another exemplary level shifter in accordance with another aspect of the disclosure.

FIG. 5 illustrates a schematic diagram of another exemplary level shifter 500 in accordance with another aspect of the disclosure. The level shifter 500 is similar to that of level shifter 400, except that the level shifter 400 includes another type of resistive devices coupled between latch transistors and input transistors, respectively. In particular, the resistive devices in the case of level shifter 500 are diode-connected NMOS.

More specifically, the level shifter 500 includes a first stage level shifter 510 including a first latch transistor PMOS P1, a first diode-connected transistor (NMOS N3), and a first complementary input transistor NMOS N1 coupled between a first voltage rail (e.g., VDDH-2) and a second voltage rail (e.g., ground). The first stage level shifter 510 further includes a second latch transistor PMOS P2, a second diode-connected transistor NMOS N4, and a second complementary input transistor NMOS N2 coupled between VDDH-2 and ground. The gates of PMOS P1 and P2 are coupled to the drains of NMOS N2 and N1, respectively.

The diode-connected NMOS N3 includes a gate and drain coupled together to form the diode configuration of NMOS N3. The gate/drain of NMOS N3 are coupled to the drain of PMOS P1. The diode-connected NMOS N3 further includes a source coupled to the drain of NMOS N1. Similarly, the diode-connected NMOS N4 includes gate and drain coupled together to form the diode configuration of NMOS N4. The gate/drain of NMOS N4 are coupled to the drain of PMOS P2. The diode-connected NMOS N4 further includes a source coupled to the drain of NMOS N2.

Complementary input voltages Vin_p and Vin_n are applied to the gates of the NMOS N1 and N2, respectively. The first stage level shifter 510 is configured to generate complementary intermediate voltages Vint_p and Vint_n at the drains of NMOS N2 and N1, respectively. As in previously-discussed level shifters, the complementary input voltages Vin_p and Vin_n may swing between a high logic voltage (e.g., VDDH-1) and a low logic voltage (e.g., ground) in accordance with a first voltage domain. The complementary intermediate voltages Vint_p and Vint_n may swing slightly less than the full swing of a high logic voltage (e.g., VDDH-2) and a low logic voltage (e.g., ground) in accordance with a second voltage domain. The slightly less swing is due to small voltage drops across the diode-connected NMOS N3 and N4.

The level shifter 500 further includes a second stage level shifter 520 to ensure that complementary output voltages Vout_p and Vou_n are able to fully swing between the high and low voltages (e.g., VDDH-2 and ground) of the second voltage domain. In particular, the second stage level shifter 520 includes a third latch transistor PMOS P3 and a third complementary input transistor NMOS N5 coupled between VDDH-2 and ground. The second stage level shifter 520 further includes a fourth latch transistor PMOS P4 and a fourth complementary input transistor NMOS N6 coupled between VDDH-2 and ground. The gates of PMOS P3 and P4 are coupled to the drains of NMOS N6 and N5, respectively.

The complementary intermediate voltages Vint_p and Vint_n generated by the first stage level shifter 510 are applied to the gates of the NMOS N5 and N6, respectively. The second stage level shifter 520 is configured to generate complementary output voltages Vou_p and Vou_n at the drains of PMOS P4 and P3, respectively. In the second stage level shifter 520, the complementary output voltages Vou_p and Vou_n are configured to fully swing between the high logic voltage (e.g., VDDH-2) and the low logic voltage (e.g., ground) of the second voltage domain. This is because the complementary output voltages Vou_p and Vou_n are generated at the drains of PMOS P4 and P3, and these devices have negligible voltage drops when they are turned on.

Figure 6A:
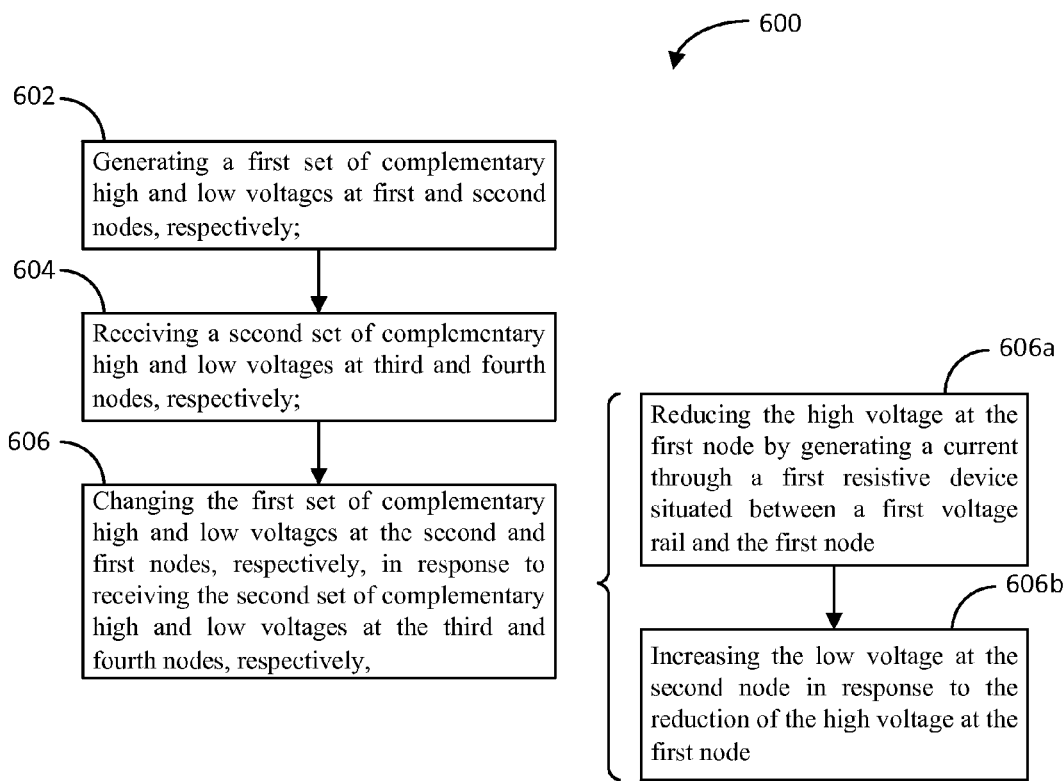
FIGS. 6A-6B illustrate flow diagrams of an exemplary method of level shifting a first set of complementary voltages in a first voltage domain to a second set of complementary voltages in a second voltage domain in accordance with another aspect of the disclosure.

FIG. 6A illustrates a flow diagram of an exemplary method 600 of level shifting a first set of complementary voltages in a first voltage domain to a second set of complementary voltages in a second voltage domain in accordance with one aspect of the disclosure. The method 600 may be implemented by any of the level shifters 200, 300, 400, and 500 previously discussed.

In particular, the method 600 includes generating a first set of complementary high and low voltages at first and second nodes, respectively (block 602). For example, with regard to level shifters 200, 300, 400, and 500, the latch circuit including PMOS P1 and P2 is an exemplary means for generating the first set of complementary high and low voltages Vou_p (Vint_p) and Vou_n (Vint_n) at respective gates (first and second nodes) of PMOS P2 and P1, respectively.

The method 600 further includes receiving a second set of complementary high and low voltages at third and fourth nodes, respectively (block 604). For example, with regard to level shifters 200, 300, 400, and 500, the input circuit including the gates of NMOS N1 and NMOS N2 is an exemplary means for receiving a second set of complementary high and low voltages Vin_p and Vin_n.

The method 600 further includes changing the first set of complementary high and low voltages at the second and first nodes, respectively, in response to receiving the second set of complementary high and low voltages at the third and fourth nodes, respectively (block 606). For example, with regard to level shifters 200, 300, 400, and 500, the input circuit including NMOS N1 and NMOS N2 is an exemplary means for configuring the first set of complementary high and low voltages to be at the second and first nodes, respectively, in response to receiving the second set of complementary high and low voltages at the third and fourth nodes, respectively.

The operation specified in block 606 of the method 600 may include reducing the high voltage at the first node by generating a current through a first resistive device situated between a first voltage rail and the first node (block 606a). For example, with regard to level shifters 200, 300, 400, and 500, the NMOS N1 is an example of a means for reducing the high voltage at the first node (gate of PMOS P2) by generating a current through a first resistive device (e.g., resistor R1, diode-connected P3, or diode-connected N3) situated between a first voltage rail VDDH-2 and the first node (block 606a). As previously discussed, when complementary high voltage is applied to the gate of NMOS N1, the high voltage turns on NMOS N1 causing current to flow from the voltage rail VDDH-2 to ground via PMOS P1, the first resistive device, and NMOS N1. The current produces a voltage drop across the first resistive device to reduce the high voltage at the first node.

The operation specified in block 606 of the method 600 may further include increasing the low voltage at the second node in response to the reduction of the high voltage at the first node (block 606b). For example, with regard to level shifters 200, 300, 400, and 500, the PMOS P2 is an example of a means for increasing the low voltage at the second node (gate of PMOS P1) in response to the reduction of the high voltage at the first node (gate of PMOS P2). As previously discussed, when the voltage at the gate of PMOS P2 is reduced to below its threshold voltage, PMOS P2 turns on to couple VDDH-2 to the gate of PMOS P1. This results in an increase in the low voltage at the gate of PMOS P1.

Figure 6B:
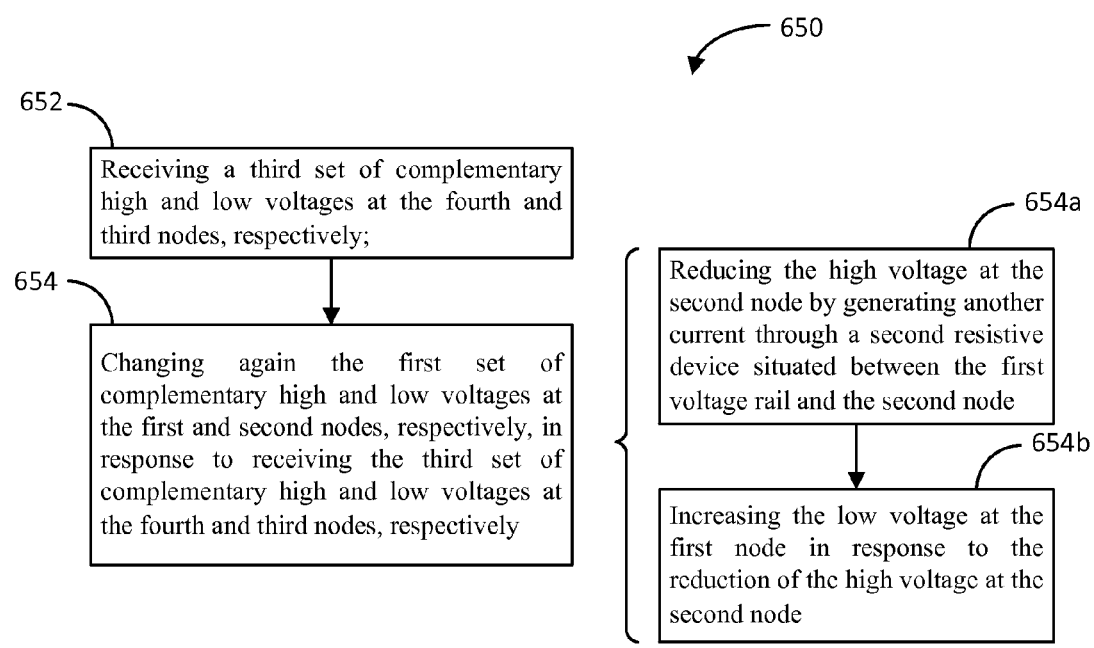

FIG. 6B illustrates a flow diagram of another exemplary method 650 of level shifting a first set of complementary voltages in a first voltage domain to a second set of complementary voltages in a second voltage domain in accordance with another aspect of the disclosure. The method 650 may be implemented by any of the level shifters 200, 300, 400, and 500 previously discussed.

The method 650 may be a continuation of the method 600 previously discussed. In other words, after the first set of complementary high and low voltage have been changed to be at the second and first nodes, respectively, a third set of complementary high and low voltages may be received to change again the first set of complementary high and low voltages to be at the first and second nodes, respectively.

In particular, the method 650 includes receiving a third set of complementary high and low voltages at the fourth and third nodes, respectively (block 652). For example, with regard to level shifters 200, 300, 400, and 500, the input circuit including the gates of NMOS N2 and NMOS N1 is an example of a means for receiving a third set of complementary high and low voltages Vin_p and Vin_n at the fourth and third nodes, respectively.

The method 650 further includes changing again the first set of complementary high and low voltages at the first and second nodes, respectively, in response to receiving the third set of complementary high and low voltages at the fourth and third nodes, respectively (block 654). For example, with regard to level shifters 200, 300, 400, and 500, the input circuit including NMOS N1 and NMOS N2 is an exemplary means for changing again the first set of complementary high and low voltages to be at the first and second nodes, respectively, in response to receiving the third set of complementary high and low voltages at the fourth and third nodes, respectively.

The operation specified in block 654 of the method 650 may include reducing the high voltage at the second node by generating a current through a second resistive device situated between the first voltage rail and the second node (block 654a). For example, with regard to level shifters 200, 300, 400, and 500, the NMOS N2 is an example of a means for reducing the high voltage at the second node (gate of PMOS P1) by generating a current through a first resistive device (e.g., resistor R2, diode-connected P4, or diode-connected N4) situated between a first voltage rail VDDH-2 and the second node. As previously discussed, when complementary high voltage is applied to the gate of NMOS N2, the high voltage turns on NMOS N2 causing current to flow from the voltage rail VDDH-2 to ground via PMOS P2, the second resistive device, and NMOS N2. The current produces a voltage drop across the second resistive device to reduce the high voltage at the second node.

The operation specified in block 654 of the method 650 may further include increasing the low voltage at the first node in response to the reduction of the high voltage at the second node (block 654b). For example, with regard to level shifters 200, 300, 400, and 500, the PMOS P1 is an example of a means for increasing the low voltage at the first node (gate of PMOS P2) in response to the reduction of the high voltage at the second node (gate of PMOS P1). As previously discussed, when the voltage at the gate of PMOS P1 is reduced to below its threshold voltage, PMOS P1 turns on to couple VDDH-2 to the gate of PMOS P2. This results in an increase in the low voltage at the gate of PMOS P2.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first level shifter configured to receive a first set of complementary voltages and generate therefrom a second set of complementary voltages, wherein the first level shifter comprises:
   a first latch circuit comprising a first p-channel field effect transistor (FET) and a p-channel second FET;
   a first input circuit comprising a first n-channel FET and a second n-channel FET, wherein gates of the first and second p-channel FETs are coupled to drains of the second and first n-channel FETs, respectively;

a first resistive device coupled between the first p-channel and n-channel FETs, wherein the first p-channel FET, the first resistive device, and the first n-channel FET are coupled in series between a first voltage rail and a second voltage rail;

a second resistive device coupled between the second p-channel and n-channel FETs, wherein the second p-channel FET, the second resistive device, and the second n-channel FET are coupled in series between the first and second voltage rails, wherein gates of the first and second n-channel FETs are configured to receive the first set of complementary voltages, and wherein the second set of complementary voltages are to be generated at the drains of the second and first n-channel FETs, respectively, wherein the second set of complementary voltages includes a high logic voltage that is lower than a voltage at the first voltage rail due to a voltage drop across the first or second resistive device because of current leakage through the first or second n-channel FET, respectively; and a second level shifter configured to generate a third set of complementary voltages based on the second set of complementary voltages, wherein the second level shifter comprises:

a second latch circuit comprising third and fourth p-channel FETs; and a second input circuit comprising third and fourth n-channel FETs, wherein gates of the third and fourth p-channel FETs are coupled to drains of the fourth and third p-channel FETs and drains of the third and fourth n-channel FETs, respectively, wherein gates of the third and fourth n-channel FETs are configured to receive the second set of complementary voltages, respectively, wherein the third set of complementary voltages are to be generated at the drains of the fourth and third n-channel FETs, respectively, wherein the third set of complementary voltages includes a high logic voltage substantially the same as the voltage at the first voltage rail.

2. The apparatus of claim 1, wherein the first set of complementary voltages pertain to a first voltage domain, wherein the third set of complementary voltages pertain to a second voltage domain, and wherein the first voltage domain is different than the second voltage domain.

3. The apparatus of claim 1, wherein the first resistive device and the second resistive device comprise first and second resistors, respectively.

4. The apparatus of claim 1, wherein the first resistive device and the second resistive device comprise first and second diode-connected transistors, respectively.

5. The apparatus of claim 1, wherein:
the first resistive device comprises a fifth p-channel FET including a source coupled to a drain of the first p-channel FET, and gate and drain coupled to the drain of the first n-channel FET; and
the second resistive device comprises a sixth p-channel FET including a source coupled to a drain of the second p-channel FET, and gate and drain coupled to the drain of the second n-channel FET.

6. The apparatus of claim 1, wherein:
the first resistive device comprises a fifth n-channel FET including drain and gate coupled to a drain of the first p-channel FET, and a source coupled to the drain of the first n-channel FET; and
the second resistive device comprises a sixth p-channel FET including drain and gate coupled to a drain of the second p-channel FET, and a source coupled to the drain of the second n-channel FET.

7. The method of claim 1, wherein the first resistive device comprises a resistor.

8. The method of claim 1, wherein the first resistive device comprises a diode-connected transistor.

9. A method, comprising:
generating a first set of complementary high and low voltages at a first node and a second node between first and second voltage rails, respectively, wherein the high voltage of the first set is less than the a voltage on the first voltage rail due to a first voltage drop across a first resistive device because of current leakage through a first n-channel FET;

receiving a second set of complementary high and low voltages at a third node and a fourth node, respectively;

changing the first set of complementary high and low voltages at the first and second nodes to a third set of complementary low and high voltages, respectively, in response to receiving the second set of complementary high and low voltages at the third and fourth nodes, respectively, wherein the high voltage of the third set is less than the voltage on the first voltage rail due to a second voltage drop across a second resistive device because of current leakage through a second n-channel FET, and wherein changing the first set of complementary high and low voltages comprises:

reducing the high voltage at the first node by generating a current through the first resistive device situated between the first voltage rail and the first node; and increasing the low voltage at the second node by coupling the first voltage rail to the second node in response to the reduction of the high voltage at the first node; and generating a fourth set of complementary low and high voltages at respective drains of series-connected p-channel and n-channel FET pair in response to changing the first set of complementary high and low voltages at the first and second nodes to the third set of complementary low and high voltages, wherein the high voltage of the fourth set is substantially the same as the voltage at the first voltage rail.

10. The method of claim 9, further comprising:
receiving a fifth set of complementary high and low voltages at the fourth and third nodes, respectively;

changing the third set of complementary high and low voltages at the second and first nodes to a sixth set of complementary low and high voltages, respectively, in response to receiving the fifth set of complementary high and low voltages at the fourth and third nodes, respectively, wherein the high voltage of the sixth set is less than the voltage on the first rail due to a third voltage drop across the first resistive device because of current leakage through the first n-channel FET, and wherein changing the third set of complementary high and low voltages comprises:

reducing the high voltage at the second node by generating another current through the second resistive device situated between the first voltage rail and the second node; and increasing the low voltage at the first node by coupling the first voltage rail to the first node in response to the reduction of the high voltage at the second node; and generating a seventh set of complementary high and low voltages at the respective drains of the series-connected p-channel and n-channel FET pair in response to changing the third set of complementary high and low voltages at the second and first nodes to the sixth set of complementary low and high voltages, wherein the high voltage of the seventh set is substantially the same as the voltage at the first voltage rail.

11. The method of claim 9, wherein the first set of complementary high and low voltages pertain to a first voltage domain, wherein the fourth set of complementary voltages pertain to a second voltage domain, and wherein the first voltage domain is different than the second voltage domain.

12. An apparatus, comprising:
means for generating a first set of complementary high and low voltages at first and second nodes between first and second voltage rails, respectively, wherein the high voltage of the first set is less than the a voltage on the first voltage rail due to a first voltage drop across a first resistive device because of current leakage through a first n-channel FET;
means for receiving a second set of complementary high and low voltages at third and fourth nodes, respectively;
means for changing the first set of complementary high and low voltages at the first and second nodes to a third set of complementary low and high voltages, respectively, in response to receiving the second set of complementary high and low voltages at the third and fourth nodes, respectively, wherein the high voltage of the third set is less than the voltage on the first voltage rail due to a second voltage drop across a second resistive device because of current leakage through a second n-channel FET, and wherein the means for changing the first set of complementary high and low voltages comprises:
    means for reducing the high voltage at the first node by generating a current through the first resistive device situated between the first voltage rail and the first node; and
    means for increasing the low voltage at the second node by coupling the first voltage rail to the second node in response to the reduction of the high voltage at the first node; and
means for generating a fourth set of complementary low and high voltages at respective drains of series-connected p-channel and n-channel FET pair in response to changing the first set of complementary high and low voltages at the first and second nodes to the third set of complementary low and high voltages, wherein the high voltage of the fourth set is substantially the same as the voltage at the first voltage rail.

13. The apparatus of claim 12, further comprising:
means for receiving a fifth set of complementary high and low voltages at the fourth and third nodes, respectively;
means for changing the third set of complementary high and low voltages at the second and first nodes to a sixth set of complementary low and high voltages, respectively, in response to receiving the sixth set of complementary high and low voltages at the fourth and third nodes, respectively, wherein the high voltage of the sixth set is less than the voltage on the first rail due to a third voltage drop across the first resistive device because of current leakage through the first n-channel FET, and wherein the means for changing the third set of complementary high and low voltages comprises:
    means for reducing the high voltage at the second node by generating another current through the second resistive device situated between the first voltage rail and the second node; and
    means for increasing the low voltage at the first node by coupling the first voltage rail to the first node in response to the reduction of the high voltage at the second node; and
means for generating a seventh set of complementary high and low voltages at the respective drains of the series-connected p-channel and n-channel FET pair in response to changing the third set of complementary high and low voltages at the second and first nodes to the sixth set of complementary low and high voltages, wherein the high voltage of the seventh set is substantially the same as the voltage at the first voltage rail.

14. The apparatus of claim 12, wherein the first set of complementary high and low voltages pertain to a first voltage domain, wherein the fourth set of complementary voltages pertain to a second voltage domain, and wherein the first voltage domain is different than the second voltage domain.

15. The apparatus of claim 12, wherein the first resistive device comprises a resistor.

16. The apparatus of claim 12, wherein the first resistive device comprises a diode-connected transistor.

* * * * *